US006764714B2

(12) United States Patent
Wei et al.

(10) Patent No.: US 6,764,714 B2
(45) Date of Patent: Jul. 20, 2004

(54) METHOD FOR DEPOSITING COATINGS ON THE INTERIOR SURFACES OF TUBULAR WALLS

(75) Inventors: Ronghua Wei, San Antonio, TX (US); Christopher Rincon, San Antonio, TX (US); James Arps, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 12 days.

(21) Appl. No.: 10/167,189

(22) Filed: Jun. 11, 2002

(65) Prior Publication Data

US 2003/0228466 A1 Dec. 11, 2003

(51) Int. Cl.[7] ......................... C23C 16/06; C23C 16/44; B05D 7/22

(52) U.S. Cl. ....................... 427/230; 427/458; 427/476; 427/482; 427/523; 427/237; 427/238; 427/239; 427/236; 427/249.1

(58) Field of Search ................................ 427/458, 472, 427/474, 475, 476, 482, 483, 450, 523, 230, 237, 238, 239, 236, 249.1, 905, 906, 902

(56) References Cited

U.S. PATENT DOCUMENTS

| | | | | |
|---|---|---|---|---|
| RE30,635 E | | 6/1981 | Kuppers et al. | 427/38 |
| 4,842,704 A | * | 6/1989 | Collins et al. | 204/192.24 |
| 5,478,608 A | | 12/1995 | Gorokhovsky | 427/571 |
| 5,681,623 A | | 10/1997 | Ferralli | 427/476 |
| 5,935,391 A | * | 8/1999 | Nakahigashi et al. | 204/192.12 |

OTHER PUBLICATIONS

Hosokawa, et al., Self–Sputtering Phenomena in High–Rate Coaxial Cylindrical Magnetron Sputtering J. Vac. Sci. Technolo., vol. 14 No. 1, Jan./Feb. 1977, pp. 143–146.

* cited by examiner

*Primary Examiner*—Michael LaVilla
(74) *Attorney, Agent, or Firm*—Paula D. Morris & Associates, P.C.

(57) ABSTRACT

Methods for coating the interior surface of tubular structures having high aspect ratios and tubular structures produced by such methods. The interior surface of the tubular structure is coated by inducing a magnetic field having a given magnitude around a circumference along a length of the tubular structure, applying a bias at a given voltage to the tubular structure, and exposing the interior surface to a precursor material to deposit the precursor material onto the interior surface of the tubular structure.

63 Claims, 1 Drawing Sheet

METHOD FOR DEPOSITING COATINGS ON THE INTERIOR SURFACES OF TUBULAR WALLS

FIELD OF THE INVENTION

The invention relates to methods for coating the interior surface of tubular structures having high aspect ratios and to tubular structures produced by such methods.

BACKGROUND OF THE INVENTION

Deposition of coatings onto the interior surface of tubular structures is needed for various applications, including, but not necessarily limited to gun barrels, automotive cylinder bores, and tubes for special applications.

Tubes with relatively large diameters have been successfully coated using known methods. However, as the diameter of the tube becomes smaller and smaller, it becomes more and more difficult to deposit a substantially uniform coating over the entire interior surface. Most methods simply do not succeed if the aspect ratio (length-to-diameter ratio) of the tube is high.

Effective and economical methods are needed to form substantially uniform coatings on interior surfaces of tubes with a high aspect ratio.

SUMMARY OF THE INVENTION

The invention provides a method for substantially uniformly coating the interior surface of a tubular structure. The invention also provides a method for coating the interior surface of a tubular structure having a high aspect ratio. The method comprises: inducing a magnetic field having a given magnitude around a circumference along a length of said tubular structure; applying a bias at a given voltage to said tubular structure; and, exposing said interior surface to a gaseous precursor material under conditions effective to convert a quantity of said gaseous precursor material to ionized gaseous precursor material, said given magnitude and said given voltage being effective to deposit said ionized gaseous precursor material onto said interior surface and to convert said ionized gaseous precursor material to a substantially uniform coating on said interior surface. More preferably: the tubular structure has an aspect ratio of at least about 3 or more, even more preferably 6 or more; the conditions comprise an operating pressure of at least about $10^{-3}$ torr; the bias and the magnetic field generate a glow discharge from said gaseous precursor material that is effective to convert said quantity of gaseous precursor material to the ionized gaseous precursor material; and, the voltage is from about 0.2 kV to about 20 kV.

In a preferred embodiment, the invention provides a method for substantially uniformly coating an interior surface of a tubular structure with amorphous carbon, said method comprising: inducing a magnetic field having a given magnitude around a circumference along a length of said tubular structure; applying a bias at a given voltage to said tubular structure; and, exposing said interior surface to a carbonaceous precursor material under conditions effective to convert a quantity of said carbonaceous precursor material to ionized carbonaceous precursor material, said given magnitude and said given voltage being effective to deposit said ionized carbonaceous precursor material onto said interior surface and to convert said ionized carbonaceous precursor material to a substantially uniform coating comprising amorphous carbon on said interior surface.

In another preferred embodiment, the invention provides a method for substantially uniformly coating an interior surface of a tubular structure with a ceramic, said method comprising: inducing a magnetic field having a given magnitude around a circumference along a length of said tubular structure; applying a bias at a given voltage to said tubular structure; and, exposing said interior surface to a gaseous organometallic precursor material under conditions effective to convert a quantity of said gaseous organometallic precursor material to ionized gaseous organometallic precursor material, said given magnitude and given voltage being effective to deposit said ionized organometallic precursor material onto said interior surface and to convert said ionized organometallic precursor material to a substantially uniform ceramic coating on said interior surface.

In yet another aspect, the invention provides a tubular structure having an aspect ratio of at least about 3 and comprises an interior surface, said interior surface comprising a substantially uniform coating generated from a gaseous precursor material. In a preferred embodiment, the interior surface comprises a substantially uniform amorphous carbon coating. In another preferred embodiment, the tubular structure has an aspect ratio of about 6 or more.

DETAILED DESCRIPTION OF THE INVENTION

The invention provides a method for coating the interior surface of a tubular structure, preferably a tubular structure having a "high aspect ratio." A "high aspect ratio" is defined herein as an aspect ratio that is sufficiently high that previous techniques for depositing coatings from gaseous precursor materials have been unable to produce a substantially uniform coating on the interior surface of the tubular structure. Typically, a high aspect ratio is a ratio of length:diameter of about 3 or more, preferably about 6 or more.

According to the present invention, glow discharge deposition is used to form a substantially uniform coating on the interior surface of tubular structures. The invention is not limited to coating the interior surface of tubular structures with a high aspect ratio; however, a preferred embodiment is to coat the interior surface of a tubular structure having a high aspect ratio.

The tubular structure made using the present invention may be comprised of substantially any material. The procedure takes place at relatively low temperatures, so thermal sensitivity is not an issue. Hence, the procedure is useful to coat materials that withstand high temperatures, such as ceramics, stainless steel, and other metal alloys, and to coat thermally sensitive materials, such as plain carbon steels and polymers.

The invention will be described further with reference to the exemplary setup 10 in FIG. 1. Persons of ordinary skill in the art will understand that many variations may be made to this setup while still remaining within the spirit and scope of the invention.

Figure 1A:
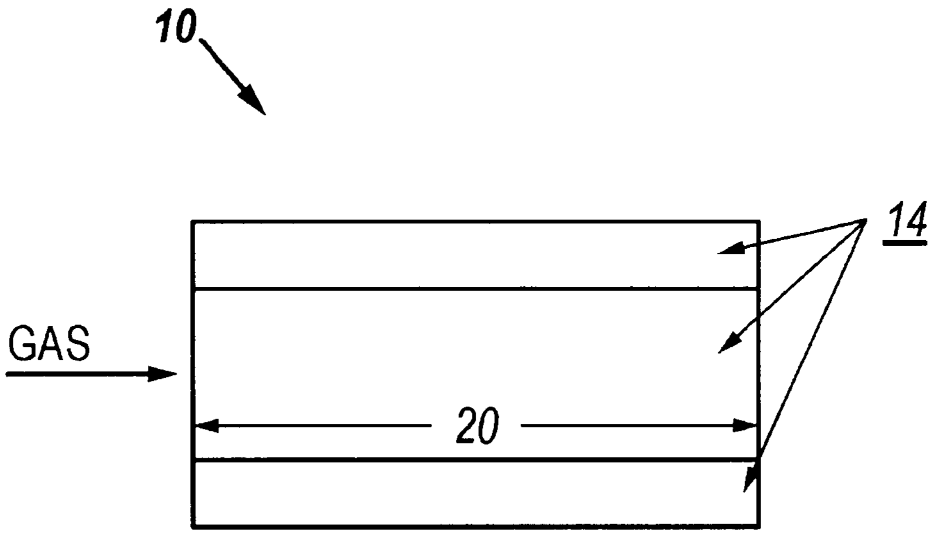
FIG. 1 is a schematic of a setup used to coat a high aspect ratio tube according to the present invention.
Figure 1B:
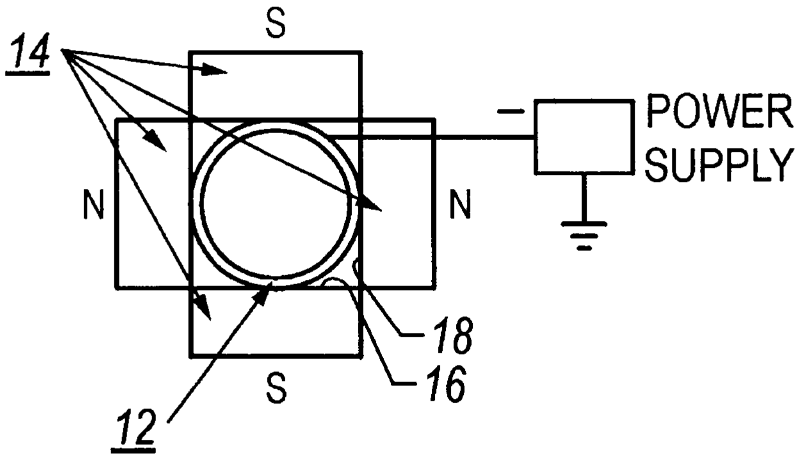

Referring to FIG. 1, a tube 12 is placed in the center of a magnetic field of at least about 1000, preferably about 3000 Gauss. In the embodiment shown in FIG. 1, the magnetic field is derived from four elongated rectangular magnets 14 spaced around the circumference of the tube (1_b_) and along the full length 20 of the tube (1_a_). The magnets 14 are positioned around the tube so that the magnetic flux coming out from the interior surface 16 of a magnet will go into the interior surface 18 of the adjacent magnet to form a complete loop. As a result, the tube 12 is exposed to four quadrants of magnetic fluxes. To increase the circumferential uniformity, a motor can be used to rotate either the magnets or the tube. Persons of ordinary skill in the art will recognize that other arrangements of magnets, such as a cylindrical magnet that completely surrounds the tube, also would produce a magnetic field that forms a complete loop. Such equivalent arrangements are encompassed by the present invention.

The entire setup 10 is placed in a vacuum chamber (not shown). Preferably, the interior surface of the tubular structure is first cleaned to remove superficial contaminants. An inert gas, such as argon gas, is backfilled into the chamber to a pressure of about 0.5 to about 100 millitorr, preferably about 15 millitorr. A pulse frequency of from about 1 Hz to about 20 kHz, preferably from about 2 kHz to about 3 kHz, at a pulse width of from about 5 microseconds to about 40 microseconds, preferably about 20 microseconds, is applied to bias the tube to at least about 200V, preferably about 4 kV, for from about 5 minutes to about 60 minutes, preferably for about 30 minutes.

At least for some inorganic substrates, preferably metal alloys, it may be necessary to treat the substrate with an intermediate material in order to form a bonding gradient between the substrate and the carbon in the carbonaceous precursor material. An example of how a metal alloy substrate may be treated to form a bonding gradient includes, but is not necessarily limited to the method described in U.S. Pat. Nos. 5,593,719; 5,605,714; 5,780,119; 5,725,573; 6,087,025; and 6,171,343, incorporated herein by reference. Applying the teachings of these patents to form the present coating on a metal alloy substrate, an interlayer of silicon is formed in a manner effective to form covalent metal-silicide bonds, and to leave an outer film of silicon. The silicon forms covalent bonds with carbon in the carbonaceous precursor material using the present method.

In order to form such a bonding gradient, or to form a silicon coating, the gaseous bonding precursor is introduced after the inert gas. In the case of a metal alloy substrate, the gaseous bonding precursor comprises silicon. Suitable silicon-containing gaseous bonding precursors include, but are not necessarily limited to silanes, trimethyl silanes, and the like. In order to introduce the gaseous bonding precursor into the vacuum chamber, the flow of the inert gas is simply halted. The gaseous bonding precursor is introduced at a rate of from about 0 to about 200 standard cubic centimeters per minute (SCCM's), depending upon the pumping speed, and to obtain a pressure of from about 0.5 to about 100 millitorr, preferably from about 10 to about 20 millitorr. A pulse frequency of from about 1 Hz to about 20 kHz, preferably from about 2 kHz to about 3 kHz, at a pulse width of about 5 microseconds to about 40 microseconds, preferably about 20 microseconds, is applied to bias the tube to about 200V, preferably about 4 kV, for from about 5 minutes to about 60 minutes, preferably for about 30 minutes.

The flow of the gaseous bonding precursor is then halted. If a silicon coating is desired, the procedure is complete. If an additional surface coating of amorphous carbon (or another material) is desired, the chamber is back-filled with a selected gaseous precursor material for the surface coating. A most preferred gaseous precursor material is a carbonaceous gaseous precursor, which is backfilled into the vacuum chamber at a rate of from about 1 SCCM to about 200 SCCM, preferably about 40 SCCM, depending upon the flow rate, and to a pressure of from about 0.5 to about 100 millitorr, preferably to about 15 millitorr. A pulse frequency of from about 1 Hz to about 20 kHz, preferably from about 2 kHz to about 3 kHz, at a pulse width of from about 5 microseconds to about 40 microseconds, preferably about 20 microseconds, is applied to bias the tube at about 200V or more, preferably about 4 kV for from about 5 minutes to about 8 hours, preferably for about 3 hours, or until a coating having a desired thickness is produced. A desired coating thickness for amorphous carbon is at least about 0.5 micron, preferably about 1 micron or more, more preferably about 2 microns or more, and even more preferably about 5 microns or more, depending upon the application. The substrate temperature during deposition is sufficiently low to avoid damaging the substrate and to allow the coating to collect on the substrate.

In each instance, a glow discharge is generated by the gaseous precursor material. Since the magnetic field is very strong inside the tube, electrons generated by the glow discharge experience many collisions before escaping from the tube. Due to their collision with molecules of the gaseous precursor material, a high flux of ionic gaseous precursor material is produced. Since the tube is biased negatively, these ions are drawn to the interior surface of the tube and impinge on the interior surface. The result is a substantially uniform coating, depending upon the gaseous precursor material used.

Substantially any coating that can be made using a gaseous precursor material may be made using the present invention. Preferred coatings include amorphous carbon coatings, metallic coatings, silicon coatings, and ceramic coatings, including but not necessarily limited to oxides, carbides, and nitrides. Most preferred coatings are amorphous carbon coatings, ceramic coatings, metallic coatings, and silicon coatings. If a hydrocarbon gas is used, such as $CH_4$ or $C_2H_2$, an amorphous carbon film forms. If an organometallic gas is used (such as Cr-, Al-, Ti-containing precursors), a metallic or ceramic coating is deposited.

As used herein, the term "amorphous carbon" refers to a carbonaceous coating composed of a mixture of "$sp^2$" and "$sp^3$" bonded carbon. "$Sp^2$" bonded carbon refers to double bonded carbon commonly associated with graphite. "$Sp^3$" bonded carbon refers to single bonded carbon. Amorphous carbon does not possess a highly ordered crystalline structure, but generally takes the form of small nanometer sized (or larger) islands of graphite dispersed within an amorphous matrix of $sp^3$ bonded carbon. Amorphous carbon made by the present glow discharge method may be essentially 100% carbon or may have a sizeable amount (up to 50 atomic %) of C—H bonded hydrogen. Amorphous carbon does not usually exist in bulk form, but is deposited as a coating or film by such methods as ion beam assisted deposition, direct ion beam deposition, magnetron sputtering, ion sputtering, chemical vapor deposition, plasma enhanced chemical vapor deposition, cathodic arc deposition, and pulsed laser deposition.

Amorphous carbon may be made according to the present invention using a simple hydrocarbon gas, such as methane or acetylene gas, as the carbonaceous precursor. The hydrocarbon gas may comprise other substituents in minor amounts, such as nitrogen, oxygen, and fluorine. Preferably the hydrocarbon gas consists essentially of carbon and hydrogen.

Diffusion pump fluids also commonly are used as precursor materials for the formation of amorphous carbon. Diffusion pump fluids have a low vapor pressure and can be vaporized stably at room temperature. Examples of diffusion pump fluids which may be modified for use as precursor materials in the present invention include, but are not necessarily limited to: polyphenyl ether; elcosyl naphthalene; i-diamyl phthalate; i-diamyl sebacate; chlorinated hydrocarbons; n-dibutyl phthalate; n-dibutyl sebacate; 2-ethyl hexyl sebacate; 2-ethyl hexyl phthalate; di-2-ethylhexyl sebacate; tri-m-cresyl phosphate; tri-p-cresyl phosphate;o-dibenzyl sebacate. Other suitable precursor materials are the vacuum-distilled hydrocarbon mineral oils manufactured by Shell Oil Company under the trademark APIEZON, and siloxanes, such as polydimethyl siloxane, pentaphenyl-trimethyl siloxane, and other silicon containing diffusion pump fluids, preferably pentaphenyl-trimethyl siloxane. Preferred diffusion pump fluids include but are not limited to, polyphenyl ether and elcosyl naphthalene. Other suitable carbonaceous precursors contain carbon and other constituent elements, such as oxygen, nitrogen, or fluorine.

A wide variety of gaseous precursors may be used to form metallic or ceramic coatings, as well. Suitable metallic precursors include, but are not necessarily limited to metal carbonyls, metal acetates, and metal alkanedionates, preferably methyl pentanedionates. Specific examples include, but are not necessarily limited to tetrakis(dimethylamino) titanium, chromium carbonyls (hexacarbonylchromium), vanadium carbonyls (hexacarbonylvanadium carbonyl), such as erbium III acetate, yttrium 2,4-pentanedionate, erbium 2,4-pantanedionate, and N,N-dimethylethanamine)-trihydridoaluminum. Preferred gaseous ceramic precursors are silane, trimethyl silane, acetylene, and methane.

The invention will be better understood with reference to the following example, which is illustrative only:

EXAMPLE 1

A 304 stainless steel tube having a length of 10.2 cm and a diameter 1.7 cm (an aspect ratio of 6) was placed in a vacuum chamber. The pressure in the vacuum chamber was pumped to $1.5\times10^{-5}$ torr. A flow of 5 standard cubic centimeters per minute (SCCM) of argon was introduced to a pressure of 15 millitorr. A pulse frequency of 3 kHz with a pulse width of 20 microseconds was applied to bias the steel tube at 4 kV for about 30 minutes. The argon gas was turned off, and silane gas ($SiH_4$) was introduced to form a metal silicide/silicon bonding region. The silane gas was introduced at 57 SCCM to obtain a pressure of 13 millitorr. A pulse frequency of 2 kHz at a pulse width of 20 microseconds was applied to bias the tube at 4 kV for about 30 minutes. Then, the silane gas was turned off, and a flow of acetylene $C_2H_2$ was introduced at about 40 SCCM, to obtain a pressure of 12 millitorr. A pulse frequency of 2 kHz at a pulse width of 20 microseconds was applied to bias the tube at 4 kV for about 3 hours. The result was a well-bonded, substantially uniform 0.50–0.6 micron coating of amorphous carbon covering the interior surface of the tube.

Persons of ordinary skill in the art will recognize that many modifications may be made to the present invention without departing from the spirit and scope of the present invention. The embodiment described herein is meant to be illustrative only and should not be taken as limiting the invention, which is defined in the following claims.

We claim:

1. A method for substantially uniformly coating an interior surface of a tubular structure, said method comprising:

inducing a magnetic field having a given magnitude around a circumference along a length of said tubul structure;

applying a bias at a given voltage to said tubular structure; and exposing said interior surface to a gaseous precursor material under conditions effective to convert a quantity of said gaseous precursor material to ionized gaseous precursor material, said given magnitude and said given voltage being effective to deposit said ionized gaseous precursor material onto said interior surface and to convert said ionized gaseous precursor material to a substantially uniform protective coating said interior surface.

2. The method of claim 1 wherein said tubular structure has a high aspect ratio.

3. The method of claim 1 wherein said tubular structure has an aspect ratio of about 3 or more.

4. The method of claim 1 wherein said tubular structure has an aspect ratio of about 6 or more.

5. The method of claim 1 wherein said conditions comprise a vacuum of at least about $10^{-3}$ torr.

6. The method of claim 2 wherein said conditions comprise a vacuum of at least about $10^{-3}$ torr.

7. The method of claim 3 wherein said conditions comprise a vacuum of at least about $10^{-3}$ torr.

8. The method of claim 4 wherein said conditions comprise a vacuum of at least about $10^{-3}$ torr.

9. The method of claim 1 wherein a combination comprising said bias and said magnetic field generate a glow discharge from said gaseous precursor material that is effective to convert said quantity of gaseous precursor material to said ionized gaseous precursor material.

10. The method of claim 2 wherein a combination comprising said bias and said magnetic field generates a glow discharge from said gaseous precursor material that is effective to convert said quantity of gaseous precursor material to said ionized gaseous precursor material.

11. The method of claim 3 wherein a combination comprising said bias and said magnetic field generates a glow discharge from said gaseous precursor material that is effective to convert said quantity of gaseous precursor material to said ionized gaseous precursor material.

12. The method of claim 4 wherein a combination comprising said bias and said magnetic field generates a glow discharge from said gaseous precursor material that is effective to convert said quantity of gaseous precursor material to said ionized gaseous precursor material.

13. The method of claim 5 wherein a combination comprising said bias and said magnetic field generates a glow discharge from said gaseous precursor material that is effective to convert said quantity of gaseous precursor material to said ionized gaseous precursor material.

14. The method of claim 6 wherein a combination comprising said bias and said magnetic field generates a glow discharge from said gaseous precursor material that is effective to convert said quantity of gaseous precursor material to said ionized gaseous precursor material.

15. The method of claim 7 wherein a combination comprising said bias and said magnetic field generates a glow discharge from said gaseous precursor material that is effective to convert said quantity of gaseous precursor material to said ionized gaseous precursor material.

16. The method of claim 8 wherein a combination comprising said bias and said magnetic field generates a glow discharge from said gaseous precursor material that is effective to convert said quantity of gaseous precursor material to said ionized gaseous precursor material.

17. The method of claim 1 wherein voltage is from about 0.2 kV to about 20 kV.

18. The method of claim 2 wherein voltage is from about 0.2 kV to about 20 kV.

19. The method of claim 8 wherein voltage is from about 0.2 kV to about 20 kV.

20. The method of claim 9 wherein voltage is from about 0.2 kV to about 20 kV.

21. The method of claim 16 wherein voltage is from about 0.2 kV to about 20 kV.

22. A method or substantially uniformly coating an interior surface of a tubular structure with amorphous carbon, said method comprising:

inducing a magnetic field having a given magnitude around a circumference along a length of said tubular structure;

applying an bias at a given voltage to said tubular structure; and exposing said interior surface to a carbonacous precursor material under conditions effective to convert a quantity of said carbonaceous precursor material to ionized carbonaceous precursor material, said given magnitude and said given voltage being effective to deposit said ionized carbonaceous precursor material onto said interior surface and to convert said ionized carbonaceous precursor material to a substantially uniform coating comprising amorphous carbon on said interior surface.

23. The method of claim 22 wherein said tubular structure has a high aspect ratio.

24. The method of claim 22 wherein said tubular structure has an aspect ratio of about 3 or more.

25. The method of claim 22 wherein said tubular structure has an aspect ratio of about 6 or more.

26. The method of claim 22 wherein said conditions comprise a vacuum of at least about $10^{-3}$ torr.

27. The method of claim 23 wherein said conditions comprise a vacuum of at least about $10^{-3}$ torr.

28. The method of claim 24 wherein said conditions comprise a vacuum of at least about $10^{-3}$ torr.

29. The method of claim 25 wherein said conditions comprise a vacuum of at least about $10^{-3}$ torr.

30. The method of claim 22 wherein a combination comprising said bias and said magnetic field generate a glow discharge from said gaseous precursor material that is effective to convert said quantity of gaseous precursor material to said ionized gaseous precursor material.

31. The method of claim 23 wherein a combination comprising said bias and said magnetic field generates a glow discharge from said gaseous precursor material that is effective to convert said quantity of gaseous precursor material to said ionized gaseous precursor material.

32. The method of claim 24 wherein a combination comprising said bias and said magnetic field generates a glow discharge from said gaseous precursor material that is effective to convert said quantity of gaseous precursor material to said ionized gaseous precursor material.

33. The method of claim 25 wherein a combination comprising said bias and said magnetic field generates a glow discharge from said gaseous precursor material that is effective to convert said quantity of gaseous precursor material to said ionized gaseous precursor material.

34. The method of claim 26 wherein a combination comprising said bias and said magnetic field generates a glow discharge from said gaseous precursor material that is effective to convert said quantity of gaseous precursor material to said ionized gaseous precursor material.

35. The method of claim 27 wherein a combination comprising said bias and said magnetic field generates a glow discharge from said gaseous precursor material that is effective to convert said quantity of gaseous precursor material to said ionized gaseous precursor material.

36. The method of claim 28 wherein a combination comprising said bias and said magnetic field generates a glow discharge from said gaseous precursor material that is effective to convert said quantity of gaseous precursor material to said ionized gaseous precursor material.

37. The method of claim 29 wherein a combination comprising said bias and said magnetic field generates a glow discharge from said gaseous precursor material that is effective to convert said quantity of gaseous precursor material to said ionized gaseous precursor material.

38. The method of claim 22 wherein voltage is from about 0.2 kV to about 20 kV.

39. The method of claim 23 wherein voltage is from about 0.2 kV to about 20 kV.

40. The method of claim 29 wherein voltage is from about 0.2 kV to about 20 kV.

41. The method of claim 30 wherein voltage is from about 0.2 kV to about 20 kV.

42. The method of claim 37 wherein voltage is from about 0.2 kV to about 20 kV.

43. A method or substantially uniformly coating an interior surface of a tubular structure with a ceramic, said method comprising:

inducing a magnetic field having a given magnitude around a circumference along a length of said tubular structure;

applying a bias at a given voltage to said tubular structure; and exposing said interior surface to a gaseous organometallic precursor material under conditions effective to convert a quantity of said gaseous organometallic precursor material to ionized gaseous organometallic precursor material, said given magnitude and given voltage being effective to deposit said ionized organometallic precursor material onto said interior surface and to convert said ionized organometally precursor material to a substantially uniform ceramic coating on said interior surface.

44. The method of claim 43 wherein said tubular structure has a high aspect ratio.

45. The method of claim 43 wherein said tubular structure has an aspect ratio of about 3 or more.

46. The method of claim 43 wherein said tubular structure has an aspect ratio of about 6 or more.

47. The method of claim 43 wherein said conditions comprise a vacuum of at least about $10^{-3}$ torr.

48. The method of claim 44 wherein said conditions comprise a vacuum of at least about $10^{-3}$ torr.

49. The method of claim 45 wherein said conditions comprise a vacuum of at least about $10^{-3}$ torr.

50. The method of claim 46 wherein said conditions comprise a vacuum of at least about $10^{-3}$ torr.

51. The method of claim 43 wherein a combination comprising said bias and said magnetic field generate a glow discharge from said gaseous precursor material that is effective to convert said quantity of gaseous precursor material to said ionized gaseous precursor material.

52. The method of claim 44 wherein a combination comprising said bias and said magnetic field generates a glow discharge from said gaseous precursor material that is effective to convert said quantity of gaseous precursor material to said ionized gaseous precursor material.

53. The method of claim 45 wherein a combination comprising said bias and said magnetic field generates a glow discharge from said gaseous precursor material that is effective to convert said quantity of gaseous precursor material to said ionized gaseous precursor material.

54. The method of claim 46 wherein a combination comprising said bias and said magnetic field generates a glow discharge from said gaseous precursor material that is effective to convert said quantity of gaseous precursor material to said ionized gaseous precursor material.

55. The method of claim 47 wherein a combination comprising said bias and said magnetic field generates a glow discharge from said gaseous precursor material that is effective to convert said quantity of gaseous precursor material to said ionized gaseous precursor material.

56. The method of claim 48 wherein a combination comprising said bias and said magnetic field generates a glow discharge from said gaseous precursor material that is effective to convert said quantity of gaseous precursor material to said ionized gaseous precursor material.

57. The method of claim 49 wherein a combination comprising said bias and said magnetic field generates a glow discharge from said gaseous precursor material that is effective to convert said quantity of gaseous precursor material to said ionized gaseous precursor material.

58. The method of claim 50 wherein a combination comprising said bias and said magnetic field generates a glow discharge from said gaseous precursor material that is effective to convert said quantity of gaseous precursor material to said ionized gaseous precursor material.

59. The method of claim 43 wherein voltage is from about 0.2 kV to about 20 kV.

60. The method of claim 46 wherein voltage is from about 0.2 kV to about 20 kV.

61. The method of claim 50 wherein voltage is from about 0.2 kV to about 20 kV.

62. The method of claim 50 wherein voltage is from about 0.2 kV to about 20 kV.

63. The method of claim 58 wherein voltage is from about 0.2 kV to about 20 kV.

* * * * *